(12) United States Patent
Yu et al.

(10) Patent No.: US 11,674,519 B2
(45) Date of Patent: Jun. 13, 2023

(54) METHOD AND DEVICE FOR EVALUATING LONG-TERM OPERATION OF TRANSFORMER OIL PUMP

(71) Applicant: STATE GRID SHANXI ELECTRIC POWER RESEARCH INSTITUTE, Shanxi (CN)

(72) Inventors: Hua Yu, Shanxi (CN); Guodong Li, Shanxi (CN); Wei Wang, Shanxi (CN); Hong Liu, Shanxi (CN); Guangqi Mu, Shanxi (CN); Aimin Wang, Shanxi (CN); Tao Jin, Shanxi (CN); Jichong Liang, Shanxi (CN); Haipeng Wang, Shanxi (CN); Yansong Li, Shanxi (CN); Hai Zhang, Shanxi (CN); Zhumao Lu, Shanxi (CN); Lu Bai, Shanxi (CN); Shan Lu, Shanxi (CN); Yanchun Li, Shanxi (CN); Xinwei Wang, Shanxi (CN)

(73) Assignee: STATE GRID SHANXI ELECTRIC POWER RESEARCH INSTITUTE, Taiyuan (CN)

(*) Notice: Subject to any disclaimer, the term of this patent is extended or adjusted under 35 U.S.C. 154(b) by 433 days.

(21) Appl. No.: 15/734,988

(22) PCT Filed: Aug. 14, 2020

(86) PCT No.: PCT/CN2020/109125
§ 371 (c)(1),
(2) Date: Dec. 3, 2020

(87) PCT Pub. No.: WO2020/253890
PCT Pub. Date: Dec. 24, 2020

(65) Prior Publication Data
US 2021/0262474 A1    Aug. 26, 2021

(30) Foreign Application Priority Data

Jun. 21, 2019   (CN) .......................... 201910545029.0

(51) Int. Cl.
*F04D 15/00* (2006.01)
*G01H 17/00* (2006.01)
(Continued)

(52) U.S. Cl.
CPC ......... *F04D 15/0088* (2013.01); *G01H 17/00* (2013.01); *G01L 13/00* (2013.01); *G01R 15/18* (2013.01); *G01R 19/0092* (2013.01)

(58) Field of Classification Search
CPC combination set(s) only.
See application file for complete search history.

(56) References Cited

U.S. PATENT DOCUMENTS

| 6,037,592 A * | 3/2000 | Sunshine | ........... G01N 21/3504 250/343 |
| 2004/0238419 A1* | 12/2004 | Dohnal | ................... H01F 27/14 210/90 |

(Continued)

FOREIGN PATENT DOCUMENTS

| CN | 101614775 A | 12/2009 |
| CN | 102621421 A | 8/2012 |

(Continued)

OTHER PUBLICATIONS

Shu-Yu Di et al., Simulation of pressure control of the import and export of a ship's ballast pump based on PLC, Ship Science and Technology, Apr. 2018, pp. 199-201, vol. 40, No. 4A.

*Primary Examiner* — Binh Q Tran

(57) ABSTRACT

A device and method for evaluating long-term operation of a transformer oil pump. An inlet of an oil pump is connected to an outlet of an oil tank through an oil pipe, and an outlet of the oil pump is connected to an inlet of the oil tank (Continued)

through an oil pipe. A pressure gauge is provided on the oil pipe to the inlet and the outlet of the oil pump, respectively. An ultra-high-frequency (UHF) sensor is provided on an inner wall of an oil pipe close to the oil pump. A pressure difference between the oil pipes to the inlet and to the outlet of the oil pump is monitored. A three-phase unbalanced current of a stator winding is monitored. The vibration of the oil pump is monitored. The rotor-to-stator rub is monitored. Based on the above inspection, a long-term health status of the oil pump is determined.

20 Claims, 2 Drawing Sheets

(51) Int. Cl.
*G01L 13/00* (2006.01)
*G01R 15/18* (2006.01)
*G01R 19/00* (2006.01)

(56) References Cited

U.S. PATENT DOCUMENTS

| | | | |
|---|---|---|---|
| 2018/0259451 A1* | 9/2018 | Buijs | G01N 1/2205 |
| 2020/0370988 A1* | 11/2020 | Rogers | E21B 21/08 |
| 2022/0128539 A1* | 4/2022 | Harris | H04Q 9/00 |

FOREIGN PATENT DOCUMENTS

| | | | | |
|---|---|---|---|---|
| CN | 103306968 A | | 9/2013 | |
| CN | 204126603 U | * | 1/2015 | |
| CN | 104575961 A | * | 4/2015 | F04C 14/08 |
| CN | 108153987 A | | 6/2018 | |
| CN | 109209922 A | | 1/2019 | |
| CN | 110017290 A | * | 7/2019 | F04C 14/08 |

* cited by examiner

METHOD AND DEVICE FOR EVALUATING LONG-TERM OPERATION OF TRANSFORMER OIL PUMP

TECHNICAL FIELD

The present invention belongs to the technical field of power equipment performance inspection, and specifically relates to a method and device for evaluating the operation performance of a grid-connected transformer oil pump.

BACKGROUND

The oil pump is an important component in the cooling system of a large transformer. After long-term operation of the transformer oil pump, especially when it has been used for 10 years, there will be some faults, such as bearing wears, inter-turn faults in the windings of the rotor and stator and rotor-to-stator rubs. If the metal powder generated after a rotor-to-stator rub of the oil pump enters the coil in the transformer, it will cause the transformer to discharge and be damaged, causing major economic losses.

When the chromatographic analysis of the oil in the transformer shows that only the content of acetylene among all the gas components changes significantly, it is often considered that there is a discharge fault inside the transformer. However, it cannot be determined whether the discharge fault occurs in the body of the transformer or in an auxiliary device (such as the submersible pump). If the inspection is carried out blindly by draining the oil or lifting the core, it will cause a great loss of the power supply load.

At present, even if the transformer oil pump passes the factory test, there is no guarantee that it can operate safely for a long time. There is a lack in technical specifications for the detection of the transformer oil pump after operation, and it is impossible to determine whether the transformer oil pump is able to run for a long time. A Chinese patent (No. ZL201310284298.9) proposes a device and method for testing a transformer oil pump. It targets only for the factory test and type test of the oil pump, and is only suitable for routine testing. It cannot evaluate the quality of the oil pump in long-term operation, and cannot detect the oil pump's abnormal vibration, rubs, and insulation failures of the stator winding.

In order to overcome the shortcomings of the prior art and fill in the technical gap of long-term operation evaluation of the transformer oil pump at home and abroad, it is necessary to test the transformer oil pump before it is installed to the transformer to fully evaluate whether the oil pump can run safely and reliably for a long time. This is of great significance to the safe operation of the transformer.

SUMMARY

The present invention provides a method and detection platform for evaluating long-term operation of a transformer oil pump. The present invention fills in the gap of long-term operation performance inspection of the transformer oil pump in the prior art, and prevents the transformer from being damaged by faults occurring after the oil pump has been in operation for a long time. The present invention can find faults such as the abnormal vibration of the oil pump, the inter-turn fault of the stator winding and the rotor-to-stator rub in advance.

To achieve the above purpose, the present invention provides the following technical solutions.

A device for evaluating long-term operation of a transformer oil pump includes an inlet pressure gauge, an outlet pressure gauge, ultrasonic sensors, an ultra-high-frequency (UHF) sensor, a current transformer, an oil tank and a signal diagnosis module, where an inlet of the oil pump is connected to an outlet of the oil tank through an oil pipe, and an outlet of the oil pump is connected to an inlet of the oil tank through an oil pipe;

the inlet pressure gauge is provided on the oil pipe close to the inlet of the oil pump, and the outlet pressure gauge is provided on the oil pipe close to the outlet of the oil pump;

the UHF sensor is provided on the oil pipe and is close to the oil pump;

multiple ultrasonic sensors are provided on a circumferential wall of the oil pump;

the current transformer is provided near the oil pump to detect a three-phase current of a stator; and signal output ends of the inlet pressure gauge, the outlet pressure gauge, the UHF sensor, the ultrasonic sensors and the current transformer are connected to an input end of the signal diagnosis module; the signal diagnosis module determines whether the transformer oil pump is capable of long-term operation according to a detection result.

The present invention further provides preferred technical solution as follows.

The device may further include an oil pipe adjusting valve, which is provided on the oil pipe between the inlet of the oil pump and the outlet of the oil tank to adjust a flow rate of oil for operating the oil pump.

The device may further include a display module, which is connected with the signal diagnosis module to display an evaluation result for long-term operation of the transformer oil pump.

The UHF sensor may be embedded in an inner wall of an oil pipe less than 0.5 m away from the oil pump; a signal line is led out from the corresponding oil pipe to the signal diagnosis module, to upload a UHF electromagnetic wave signal in the oil pump obtained under a test condition to the signal diagnosis module.

12 ultrasonic sensors may be provided on a circumference of the oil pump; these ultrasonic sensors are equally 30 degrees spaced apart in a circumferential direction of the oil pump to detect abnormal vibrations of different parts in simultaneous domain under the test condition; a lead wire of each ultrasonic sensor is connected to the signal diagnosis module; if an output signal of an ultrasonic sensor is found exceeding a set threshold, an abnormal position of the oil pump is located according to the output signal of the ultrasonic sensor.

In the detection of a three-phase unbalanced current of a stator winding, an impeller of the oil pump may be locked by using a clamp; the current transformer monitors the three-phase unbalanced current of the stator winding under the condition of the locked impeller of the oil pump, and uploads a three-phase unbalanced current signal to the signal diagnosis module.

According to a received pressure difference between the inlet and the outlet of the oil pump, the UHF electromagnetic wave signal detected by the UHF sensor, the ultrasonic signal and the three-phase unbalanced current signal, the signal diagnosis module may comprehensively evaluate a long-term operation status of the transformer oil pump, and display an evaluation result through the display module.

The present invention further provides a method for evaluating long-term operation of a transformer oil pump, where the evaluating method includes the following steps:

step 1: disposing an inlet pressure gauge and an outlet pressure gauge on an oil pipe close to an inlet and an outlet of an oil pump, respectively; detecting a pressure difference between the inlet and the outlet of the oil pump within a first set time when the oil pump runs at a rated speed; comparing a maximum pressure difference between the inlet and the outlet of the oil pump and a set pressure difference threshold; determining a dynamic stability characteristic value Pk;

step 2: locking an impeller of the oil pump, and making a stator winding current greater than a rated current; enabling the oil pump to run continuously for a second set time; detecting a three-phase unbalanced current of a stator winding through a current transformer; comparing the three-phase unbalanced current with a set unbalance rate threshold; determining an inter-turn insulation characteristic value PI of the oil pump;

step 3: disposing multiple ultrasonic sensors on a circumferential wall of the oil pump;

making the oil pump run to a set speed and run continuously for a third set time; obtaining an ultrasonic signal by the ultrasonic sensor, and comparing the ultrasonic signal with a set ultrasonic signal threshold; determining an abnormal vibration characteristic value Pc of the oil pump;

step 4: disposing a UHF sensor on the oil pipe close to the oil pump; making the oil pump run to a set speed and run continuously for a fourth set time; detecting, by the UHF sensor, a UHF electromagnetic wave signal of the oil pump at the set speed; comparing the UHF electromagnetic wave signal with a set UHF electromagnetic wave threshold; determining a friction characteristic value Pt of the oil pump; and step 5: determining an operation status of the oil pump according to the maximum pressure difference between the inlet and the outlet of the oil pump, the three-phase unbalanced current of the stator winding, the ultrasonic signal in the oil pump and the UHF electromagnetic wave signal.

The method for evaluating long-term operation of a transformer oil pump further provides preferred technical solution as follows.

In step 1, the first set time may be 1 h, and the maximum pressure difference is the maximum pressure difference between the inlet and the outlet of the oil pump within 1 h.

The maximum difference between an inlet pressure Pk1 and an outlet pressure Pk2 of the oil pump may be calculated, and compared with a set threshold, to determine the dynamic stability characteristic value Pk:

$|Pk1-Pk2|>0.1$ Mpa, $Pk=0$ $0.05<|Pk1-Pk2|\leq 0.1$ Mpa, $Pk=1$ $|Pk1-Pk2|\leq 0.05$ Mpa, $Pk=2$ where, Pk1 is a reading of the inlet pressure gauge P1, in Mpa; Pk2 is a reading of the outlet pressure gauge value P2, in Mpa; Pk is a pressure difference interval corresponding to different values; 0.05 Mpa and 0.1 Mpa are set pressure difference thresholds; a larger maximum difference between the inlet pressure Pk1 and the outlet pressure Pk2 of the oil pump indicates that the oil pump is more likely to be instable.

In step 2, the second set time may be 2 min; the three-phase unbalanced current of the stator winding is continuously monitored within 2 min; if an unbalance rate of the three-phase stator current is less than 8% within 2 min, PI is 2; if the unbalance rate of the three-phase stator current is less than 8% in the first minute, PI is 1; otherwise, PI is 0; a set imbalance rate threshold is 8%.

In step 3, the set speed may be 1.1 times the rated speed; the third set time is 30 min; there are 12 ultrasonic sensors equally spaced 30 degrees apart in a circumferential direction of the oil pump;

if effective values of the ultrasonic signals of the ultrasonic sensors are all less than 6 mV and the effective values of the ultrasonic signals under 100 HZ are less than 2 mV, Pc is 2; if the effective values of the ultrasonic signals of the ultrasonic sensors are less than 6 mV or the effective values of the ultrasonic signals under 100 HZ are less than 2 mV, Pc is 1; if the effective value of the ultrasonic signal of one of the ultrasonic sensors is less than 6 mV and the effective value of the ultrasonic signal under 100 HZ is less than 2 mV, Pc is 0.

In step 4, the set speed may be 1.1 times the rated speed; the fourth set time is 60 min; the UHF sensor operates between 300 MHZ and 3 GHZ, and the UHF electromagnetic wave signal detected is a characteristic signal of 300 MHZ to 3 GHZ;

the oil pump runs at a speed that is 1.1 times the rated speed; if there is no abnormal partial discharge signal within 60 min and the discharge capacity, i.e. the amplitude of the UHF electromagnetic wave signal is less than 50 mV, Pt is 2; if there is no abnormal partial discharge signal only in the first 30 min and the discharge capacity, i.e. the amplitude of the UHF electromagnetic wave signal is less than 50 mV, Pt is 1; otherwise, Pt is 0.

The following evaluation may be performed on whether the transformer oil pump is capable of long-term operation:

$$P=0.4Pk+0.2PI+0.25Pc+0.15Pt$$

when P is less than 1, the performance of the oil pump is evaluated as poor, the oil pump is determined as unable to run for a long time, and it is not recommended to use the oil pump;

when $1\leq P<1.5$, the performance of the oil pump is evaluated as medium, and the oil pump is capable of long-term operation, but the operation status of the oil pump should be inspected regularly during the operation;

when $1.5\leq P<2$, the performance of the oil pump is evaluated as good, and the oil pump is capable of long-term operation;

when $P=2$, the performance of the oil pump is evaluated as excellent, and the oil pump is capable of long-term operation.

Compared with the prior art, the present invention has the following beneficial technical effects:

Before the oil pump is put into operation, the technical solution of the present invention determines whether the oil pump will have common faults such as the rotor-to-stator rub, the inter-turn fault of the stator winding and rotor instability, and comprehensively evaluates whether the oil pump can run for a long time. The present invention simulates the long-term operating conditions of the oil pump and carries out corresponding detection. The present invention evaluates the operating stability of the rotor of the oil pump through the analysis of the pressure difference between the inlet and outlet of the oil pump. The present invention adjusts the speed of the rotor to 1.1 times the rated speed, and performs simultaneous ultrasonic monitoring every 30 degrees on the circumference of the oil pump, realizing the accurate fault location of the oil pump and the comparative analysis of abnormal signals. The present invention embeds an ultra-high frequency (UHF) sensor in the pipe of the oil circuit to evaluate the rotor-to-stator rub. The present invention realizes the insulation evaluation of the stator winding through the three-phase unbalanced current monitoring of the stator under the condition of a locked-rotor and realizes the stator insulation diagnosis under severe conditions. The implementation of the present invention is of great significance for ensuring the long-term safe operation of the transformer.

Figure 1:
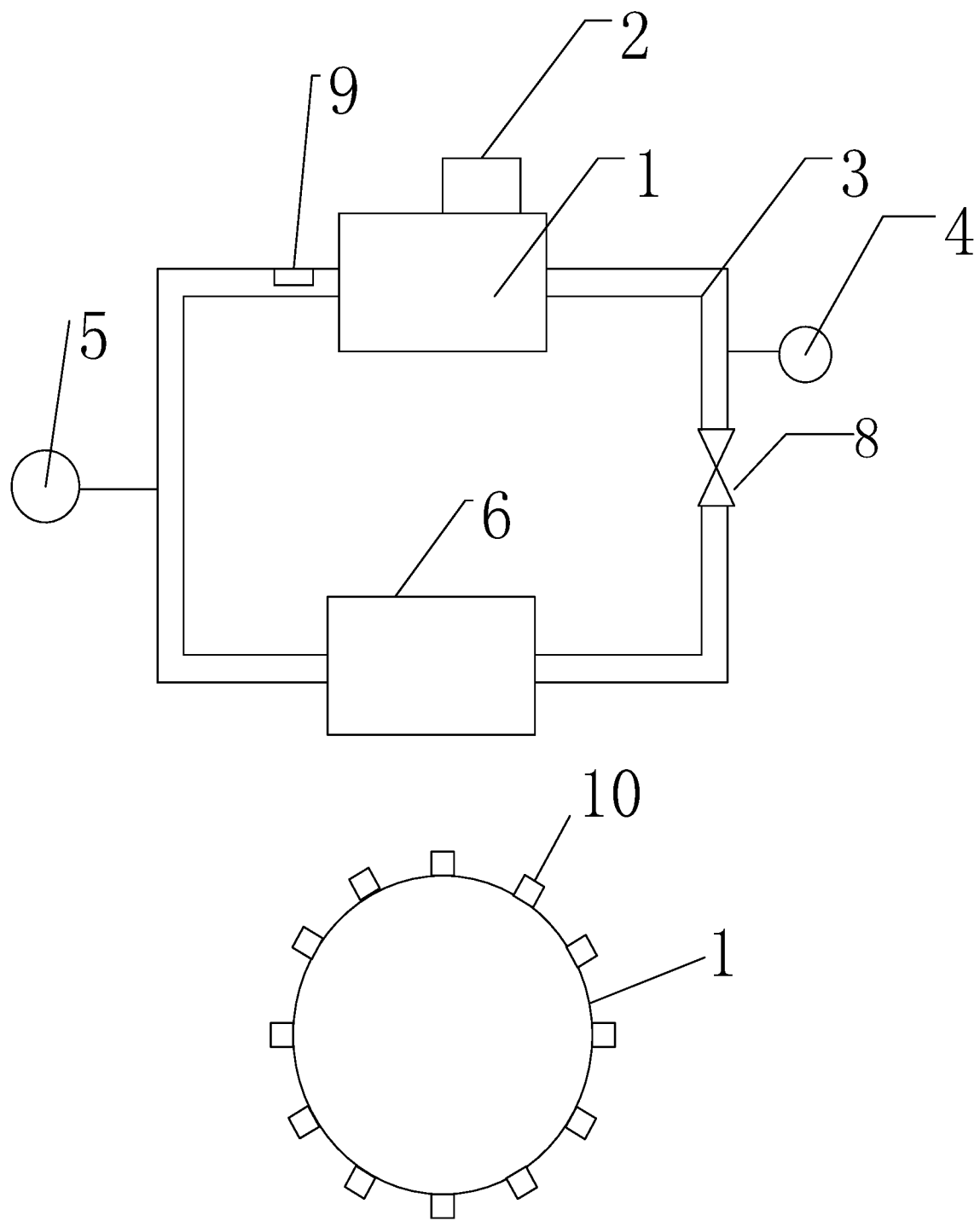
FIG. 1 is a structural diagram of a device for evaluating long-term operation of a transformer oil pump according to the disclosure.

REFERENCE NUMERALS 1. oil pump; 2. junction box; 3. oil inlet; 4. inlet pressure gauge; 5. outlet pressure gauge; 6. oil tank; 8. oil pipe regulating valve; 9. ultra-high-frequency (UHF) sensor; and 10. ultrasonic sensors around oil pump shell.

DETAILED DESCRIPTION

The technical solutions of the present invention are described in more detail below with reference to the accompanying drawings and specific embodiments.

FIG. 1 is a structural diagram of a device for evaluating long-term operation of a transformer oil pump according to the disclosure. The present invention provides a device for monitoring a long-term operation status of a transformer oil pump. The monitoring device includes an oil pump 1, a junction box 2, an inlet pressure gauge 4, an outlet pressure gauge 5, an oil tank 6, an oil pipe regulating valve 8, an ultra-high-frequency (UHF) sensor 9, an ultrasonic sensor 10, a signal diagnosis module (not shown in the figure) and a display module (not shown in the figure).

An inlet of the oil pump 1 is connected to an outlet of the oil tank 6 through an oil pipe, and an outlet of the oil pump 1 is connected to an inlet of the oil tank 6 through an oil pipe. The inlet pressure gauge 4 is provided on the oil pipe to the inlet of the oil pump 1, and the outlet pressure gauge 5 is provided on the oil pipe to the outlet of the oil pump 1. The distances from the inlet pressure gauge 4 and the outlet pressure gauge 5 to the oil pump should preferably be the same. When the oil pump 1 and the oil tank 6 are connected, the oil pump 1 is operated to a rated power. The oil pipe regulating valve 8 is controlled to simulate the actual operating conditions of the oil pump 1. An inlet pressure Pk1 and an outlet pressure Pk2 of the oil pump 1 are detected through the inlet pressure gauge 4 and the outlet pressure gauge 5. A pressure difference between the inlet and the outlet is calculated to determine the dynamic stability of an impeller inside the oil pump.

The UHF sensor 9 is provided on the oil pipe and is close to the oil pump 1 (the UHF sensor operates between 300 MHZ and 3 GHZ, and a UHF electromagnetic wave signal to be detected is a characteristic signal of 300 MHZ to 3 GHZ). In a preferred embodiment of the present invention, the UHF sensor 9 is embedded on an inner wall of the oil pipe less than 0.5 m away from the oil pump 1, and led out from the oil pipe through a signal line to the signal diagnosis module.

The oil pump 1 is operated under a test condition, and an abnormal partial discharge signal of the oil pump 1 is monitored through the UHF sensor 9 within a set time to determine the mechanical friction in the oil pump 1. In a preferred embodiment of the present invention, the test condition refers to that the oil pump 1 operates at 1.1 times a rated speed, and the output signal of the UHF sensor 9 is monitored within 60 min.

In the present invention, referring to FIG. 1, preferably, 12 ultrasonic sensors 10 are provided on a circumference of the oil pump 1. These ultrasonic sensors 12 are equally 30 degrees spaced apart in a circumferential direction of the oil pump to detect the abnormal vibration of different parts in same time domain under the test condition. A lead wire of each ultrasonic sensor 12 is connected to the signal diagnosis module. If an output signal of an ultrasonic sensor 12 is found exceeding a set threshold, an abnormal position of the oil pump is located according to the output signal of the ultrasonic sensor. It should be noted that the arrangement of 12 ultrasonic sensors is only a preferred solution of the present invention. Those skilled in the art should understand that other numbers of ultrasonic sensors may also be provided as required, but the spacing between the ultrasonic sensors should be preferably kept consistent.

In the embodiment of the present invention, an input voltage of the oil pump 1 is adjusted until the speed of the oil pump reaches 1.1 times the rated speed. The ultrasonic sensors are equally 30 degrees spaced apart along the circumference of an axial shell of the oil pump. The oil pump runs continuously for 30 min for monitoring, and it is determined whether the transformer oil pump has abnormal vibration. If the output signal of an ultrasonic sensor 12 is found exceeding a set threshold, an abnormal position of the oil pump 1 is located according to the signal of the ultrasonic sensor 12.

A current transformer (not shown in the figure) is provided near the oil pump 1 to detect a three-phase current of a stator. The impeller of the oil pump 1 is locked by a clamp (it should be noted that in the implementation of the present invention, other methods can be used besides the clamp, as long as the impeller of the oil pump 1 can be locked). The current transformer monitors the three-phase unbalanced current of the stator winding under the condition of the locked impeller of the oil pump, and uploads a three-phase unbalanced current signal to the signal diagnosis module. In the preferred embodiment of the present invention, the oil pump runs continuously for 2 min under the conditions of a rated voltage applied to the stator winding and the locked rotor. Then it is determined whether the insulation level of the stator winding of the oil pump 1 meets the requirements of long-term operation.

The signal output ends of the inlet pressure gauge 4, the outlet pressure gauge 5, the UHF sensor 9, the ultrasonic sensor 10 and the current transformer are connected to an input end of the signal diagnosis module. The signal diagnosis module determines whether the transformer oil pump is capable of long-term operation according to a detection result, and displays an evaluation result and detection parameters of each sensor through a display module.

Figure 2:
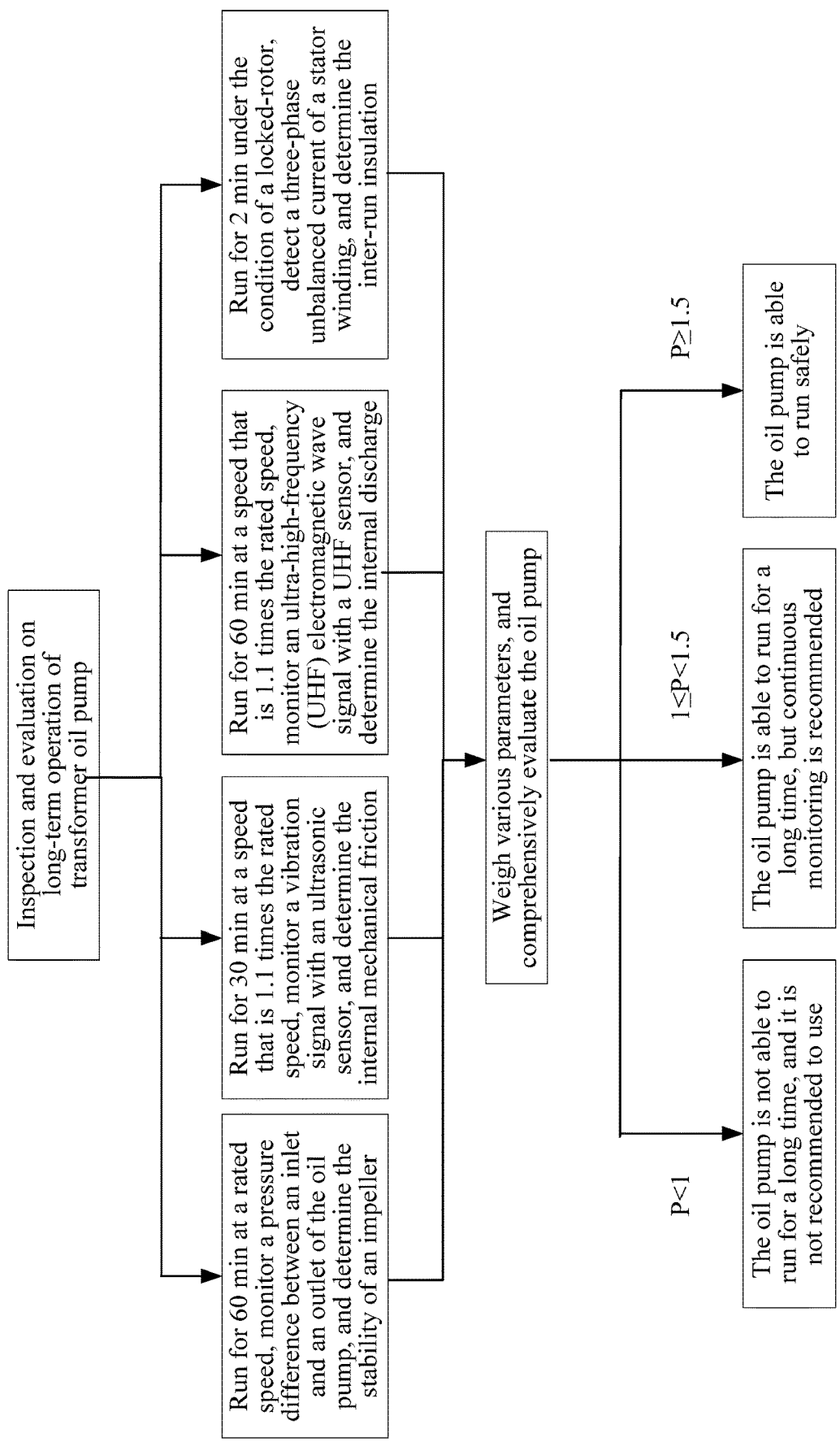
FIG. 2 is a flowchart of a method for evaluating long-term operation of a transformer oil pump according to the disclosure.

The present invention further provides a method for evaluating long-term operation of a transformer oil pump. As shown in FIG. 2, the method includes the following steps:

Step 1: Dispose an inlet pressure gauge and an outlet pressure gauge on an oil pipe close to an inlet and an outlet of an oil pump, respectively; detect a pressure difference between the inlet and the outlet of the oil pump within a first set time when the oil pump runs at a rated speed; compare a maximum pressure difference between the inlet and the outlet of the oil pump and a set pressure difference threshold; determine a dynamic stability characteristic value Pk.

In Step 1, when the oil pump runs at the rated speed, the maximum difference between the inlet pressure Pk1 and the outlet pressure Pk2 of the oil pump and the set pressure difference threshold meet the following conditions:

$$|Pk1-Pk2|>0.1 \text{ Mpa}, Pk=0$$

$$0.05<|Pk1-Pk2|\leq 0.1 \text{ Mpa}, Pk=1$$

$$|Pk1-Pk2|\leq 0.05 \text{ Mpa}, Pk=2$$

Herein, Pk1 is a reading of the inlet pressure gauge P1, in Mpa. Pk2 is a reading of the outlet pressure gauge value P2, in Mpa. Pk is a pressure difference interval corresponding to different values; 0.05 Mpa and 0.1 Mpa are set pressure difference thresholds.

Step 2: Lock an impeller of the oil pump, and make a stator winding current greater than a rated current; enable the oil pump to run continuously for a second set time; detect a three-phase unbalanced current of a stator winding through a current transformer; compare the three-phase unbalanced current with a set unbalance rate threshold; determine an inter-turn insulation characteristic value PI of the oil pump.

In Step 2, the oil pump runs continuously for 2 min under the conditions of a rated voltage applied to the stator winding and the locked rotor. Then it is determined whether the insulation level of the stator winding of the oil pump meets the requirements of long-term operation.

The three-phase unbalanced current of the stator winding is continuously monitored within 2 min.

If an unbalance rate of the three-phase stator current is less than 8% within 2 min, PI is 2.

If the unbalance rate of the three-phase stator current is less than 8% in the first minute, PI is 1.

Otherwise, PI is 0. The set imbalance rate threshold is 8%.

Step 3: Dispose multiple ultrasonic sensors on a circumferential wall of the oil pump; make the oil pump run to a set speed and run continuously for a third set time; obtain an ultrasonic signal by the ultrasonic sensor, and compare the ultrasonic signal with a set ultrasonic signal threshold; determine an abnormal vibration characteristic value Pc of the oil pump.

In Step 3, the input voltage of the oil pump is adjusted until the speed of the oil pump reaches 1.1 times the rated speed. The ultrasonic sensors are equally 30 degrees spaced apart along the circumference of an axial shell of the oil pump. The oil pump runs continuously for 30 min for monitoring, and it is determined whether the transformer oil pump has abnormal vibration. 12 ultrasonic sensors are used to detect the vibration of the oil pump in same time domain:

If effective values of the ultrasonic signals of the ultrasonic sensors are all less than 6 mV and the effective values of the ultrasonic signals under 100 HZ are less than 2 mV, Pc is 2.

If the effective values of the ultrasonic signals of the ultrasonic sensors are less than 6 mV or the effective values of the ultrasonic signals under 100 HZ are less than 2 mV, Pc is 1.

If the effective value of the ultrasonic signal of one of the ultrasonic sensors is less than 6 mV and the effective value of the ultrasonic signal under 100 HZ is less than 2 mV, Pc is 0.

Step 4: Dispose a UHF sensor on the oil pipe close to the oil pump; make the oil pump run to a set speed and run continuously for a fourth set time; detect, by the UHF sensor, a UHF electromagnetic wave signal of the oil pump at the set speed; compare the UHF electromagnetic wave signal with a set UHF electromagnetic wave threshold; determine a friction characteristic value Pt of the oil pump.

In step 4, the input voltage of the oil pump is adjusted until the speed of the oil pump speed reaches 1.1 times the rated speed. The oil pump is allowed to run continuously for 60 min. If there is no abnormal partial discharge signal within 60 min and the discharge capacity or signal amplitude is less than 50 mV, Pt is 2.

If there is no abnormal partial discharge signal only in the first 30 min and the discharge capacity or signal amplitude is less than 50 mV, Pt is 1; otherwise, Pt is 0.

Step 5: Determine an operation status of the oil pump according to the maximum pressure difference between the inlet and the outlet of the oil pump, the three-phase unbalanced current of the stator winding, the ultrasonic signal in the oil pump and the UHF electromagnetic wave signal.

In Step 5, evaluation is performed on whether the transformer oil pump is capable of long-term operation, and each parameter is weighed.

$$P=0.4Pk+0.2PI+0.25Pc+0.15Pt$$

If P is less than 1, the performance of the oil pump is evaluated as poor, the oil pump is determined as unable to run for a long time, and it is not recommended to use the oil pump.

If $1\leq P<1.5$, the performance of the oil pump is evaluated as medium, and the oil pump is capable of long-term operation, but the operation status of the oil pump should be inspected regularly during the operation.

If $1.5\leq P<2$, the performance of the oil pump is evaluated as good, and the oil pump is capable of long-term operation.

If P=2, the performance of the oil pump is evaluated as excellent, and the oil pump is capable of long-term operation.

Embodiment 1: An oil pump was inspected. The three-phase unbalanced current of the stator of the oil pump was qualified, and PI was 2. The pressure difference between the inlet and the outlet of the oil pump was greater than 0.1 Mpa, and Pk was 0. At a speed that was 1.1 times the rated speed, the effective value of the ultrasonic signal was 8 mV, and the effective value of the ultrasonic signal at 100 HZ was 3.6 mV, indicating that there was an obvious vibration signal. After the oil pump ran for 24 min, the discharge capacity or signal amplitude was 80 mV, indicating an abnormal signal. Through comprehensive evaluation, P was 0.4, and the status of the oil pump was determined as poor. Then the oil pump was disassembled and inspected, and it was found that the bearings of the oil pump were damaged, which caused the impeller to lose stability, resulting in abnormal vibration and friction.

It should be noted that the above embodiments are merely intended to describe the technical solutions of the present invention, rather than to limit the present invention. Although the present invention is described in detail with reference to the above embodiments, a person of ordinary skill in the art may still make modifications or equivalent substitutions to the specific implementations of the present invention without departing from the spirit and scope of the present invention. However, these modifications or equivalent substitutions should fall within the protection scope of the claims of the present invention.

The invention claimed is:

1. A device for evaluating long-term operation of a transformer oil pump, comprising an inlet pressure gauge, an outlet pressure gauge, ultrasonic sensors, an ultra-high-frequency (UHF) sensor, a current transformer, an oil tank and a signal diagnosis module, wherein an inlet of the oil pump is connected to an outlet of the oil tank through an oil pipe, and an outlet of the oil pump is connected to an inlet of the oil tank through an oil pipe;

the inlet pressure gauge is provided on the oil pipe close to the inlet of the oil pump, and the outlet pressure gauge is provided on the oil pipe close to the outlet of the oil pump;

the UHF sensor is provided on the oil pipe and is close to the oil pump;

a plurality of ultrasonic sensors are provided on a circumferential wall of the oil pump;

the current transformer is provided near the oil pump to detect a three-phase current of a stator;

signal output ends of the inlet pressure gauge, the outlet pressure gauge, the UHF sensor, the ultrasonic sensors and the current transformer are connected to an input end of the signal diagnosis module; the signal diagnosis module determines whether the transformer oil pump is capable of long-term operation according to a detection result.

2. The device for evaluating long-term operation of a transformer oil pump according to claim 1, wherein
the device for evaluating long-term operation of the transformer oil pump further comprises an oil pipe adjusting valve, which is provided on the oil pipe between the inlet of the oil pump and the outlet of the oil tank to adjust a flow rate of oil for operating the oil pump.

3. The device for evaluating long-term operation of a transformer oil pump according to claim 1, wherein
the device for evaluating long-term operation of the transformer oil pump further comprises a display module, which is connected with the signal diagnosis module to display an evaluation result for long-term operation of the transformer oil pump.

4. The device for evaluating long-term operation of a transformer oil pump according to claim 1, wherein
the UHF sensor is embedded in an inner wall of an oil pipe less than 0.5 m away from the oil pump; a signal line is led out from the corresponding oil pipe to the signal diagnosis module, to upload a UHF electromagnetic wave signal in the oil pump obtained under a test condition to the signal diagnosis module.

5. The device for evaluating long-term operation of a transformer oil pump according to claim 4, wherein
12 ultrasonic sensors are provided on a circumference of the oil pump; these ultrasonic sensors are equally 30 degrees spaced apart in a circumferential direction of the oil pump to detect abnormal vibrations of different parts in simultaneous domain under the test condition; a lead wire of each ultrasonic sensor is connected to the signal diagnosis module; if an output signal of an ultrasonic sensor is found exceeding a set threshold, an abnormal position of the oil pump is located according to the output signal of the ultrasonic sensor.

6. The device for evaluating long-term operation of a transformer oil pump according to claim 5, wherein
in the detection of a three-phase unbalanced current of a stator winding, an impeller of the oil pump is locked by using a clamp; the current transformer monitors the three-phase unbalanced current of the stator winding under the condition of the locked impeller of the oil pump, and uploads a three-phase unbalanced current signal to the signal diagnosis module.

7. The device for evaluating long-term operation of a transformer oil pump according to claim 6, wherein according to a received pressure difference between the inlet and the outlet of the oil pump, the UHF electromagnetic wave signal detected by the UHF sensor, the ultrasonic signal and the three-phase unbalanced current signal, the signal diagnosis module comprehensively evaluates a long-term operation status of the transformer oil pump, and displays an evaluation result through the display module.

8. A method for evaluating long-term operation of a transformer oil pump, wherein the evaluating method comprises following steps:

step 1: disposing an inlet pressure gauge and an outlet pressure gauge on an oil pipe close to an inlet and an outlet of an oil pump, respectively; detecting a pressure difference between the inlet and the outlet of the oil pump within a first set time when the oil pump runs at a rated speed; comparing a maximum pressure difference between the inlet and the outlet of the oil pump and a set pressure difference threshold; determining a dynamic stability characteristic value Pk;

step 2: locking an impeller of the oil pump, and making a stator winding current greater than a rated current; enabling the oil pump to run continuously for a second set time; detecting a three-phase unbalanced current of a stator winding through a current transformer; comparing the three-phase unbalanced current with a set unbalance rate threshold; determining an inter-turn insulation characteristic value PI of the oil pump;

step 3: disposing multiple ultrasonic sensors on a circumferential wall of the oil pump; making the oil pump run to a set speed and run continuously for a third set time; obtaining an ultrasonic signal by the ultrasonic sensor, and comparing the ultrasonic signal with a set ultrasonic signal threshold; determining an abnormal vibration characteristic value Pc of the oil pump;

step 4: disposing a UHF sensor on the oil pipe close to the oil pump; making the oil pump run to a set speed and run continuously for a fourth set time; detecting, by the UHF sensor, a UHF electromagnetic wave signal of the oil pump at the set speed; comparing the UHF electromagnetic wave signal with a set UHF electromagnetic wave threshold; determining a friction characteristic value Pt of the oil pump; and step 5: determining an operation status of the oil pump according to the maximum pressure difference between the inlet and the outlet of the oil pump, the three-phase unbalanced current of the stator winding, the ultrasonic signal in the oil pump and the UHF electromagnetic wave signal.

9. The method for evaluating long-term operation of a transformer oil pump according to claim 8, wherein
in step 1, the first set time is 1 h, and the maximum pressure difference is the maximum pressure difference between the inlet and the outlet of the oil pump within 1 h.

10. The method for evaluating long-term operation of a transformer oil pump according to claim 9, wherein
the maximum difference between an inlet pressure Pk1 and an outlet pressure Pk2 of the oil pump is calculated, and compared with a set threshold, to determine the dynamic stability characteristic value Pk:

$|Pk1-Pk2|>0.1$ Mpa, $Pk=0$ $0.05<|Pk1-Pk2|\le 0.1$ Mpa, $Pk=1$ $|Pk1-Pk2|\le 0.05$ Mpa, $Pk=2$ wherein, Pk1 is a reading of the inlet pressure gauge P1, in Mpa; Pk2 is a reading of the outlet pressure gauge value P2, in Mpa; Pk is a pressure difference interval corresponding to different values; 0.05 Mpa and 0.1 Mpa are set pressure difference thresholds; a larger maximum difference between the inlet pressure Pk1 and the outlet pressure Pk2 of the oil pump indicates that the oil pump is more likely to be instable.

11. The method for evaluating long-term operation of a transformer oil pump according to claim 10, wherein
in step 2, the second set time is 2 min; the three-phase unbalanced current of the stator winding is continuously monitored within 2 min; if an unbalance rate of the three-phase stator current is less than 8% within 2 min, PI is 2; if the unbalance rate of the three-phase stator current is less than 8% in the first minute, PI is 1; otherwise, PI is 0; a set imbalance rate threshold is 8%.

12. The method for evaluating long-term operation of a transformer oil pump according to claim 11, wherein
in step 3, the set speed is 1.1 times the rated speed; the third set time is 30 min; there are 12 ultrasonic sensors equally spaced 30 degrees apart in a circumferential direction of the oil pump;
if effective values of the ultrasonic signals of the ultrasonic sensors are all less than 6 mV and the effective values of the ultrasonic signals under 100 HZ are less than 2 mV, Pc is 2; if the effective values of the ultrasonic signals of the ultrasonic sensors are less than 6 mV or the effective values of the ultrasonic signals under 100 HZ are less than 2 mV, Pc is 1; if the effective value of the ultrasonic signal of one of the ultrasonic sensors is less than 6 mV and the effective value of the ultrasonic signal under 100 HZ is less than 2 mV, Pc is 0.

13. The method for evaluating long-term operation of a transformer oil pump according to claim 12, wherein
in step 4, the set speed is 1.1 times the rated speed; the fourth set time is 60 min; the UHF sensor operates between 300 MHZ and 3 GHZ, and the UHF electromagnetic wave signal detected is a characteristic signal of 300 MHZ to 3 GHZ;
the oil pump runs at a speed that is 1.1 times the rated speed; if there is no abnormal partial discharge signal within 60 min and the discharge capacity, i.e. the amplitude of the UHF electromagnetic wave signal is less than 50 mV, Pt is 2; if there is no abnormal partial discharge signal only in the first 30 min and the discharge capacity, i.e. the amplitude of the UHF electromagnetic wave signal is less than 50 mV, Pt is 1; otherwise, Pt is 0.

14. The method for evaluating long-term operation of a transformer oil pump according to claim 13, wherein
the following evaluation is performed on whether the transformer oil pump is capable of long-term operation:

$P=0.4Pk+0.2PI+0.25Pc+0.15Pt$ when P is less than 1, the performance of the oil pump is evaluated as poor, the oil pump is determined as unable to run for a long time, and it is not recommended to use the oil pump;
when $1 \leq P < 1.5$, the performance of the oil pump is evaluated as medium, and the oil pump is capable of long-term operation, but the operation status of the oil pump should be inspected regularly during the operation;
when $1.5 \leq P < 2$, the performance of the oil pump is evaluated as good, and the oil pump is capable of long-term operation;
when $P=2$, the performance of the oil pump is evaluated as excellent, and the oil pump is capable of long-term operation.

15. The device for evaluating long-term operation of a transformer oil pump according to claim 2, wherein
the device for evaluating long-term operation of the transformer oil pump further comprises a display module, which is connected with the signal diagnosis module to display an evaluation result for long-term operation of the transformer oil pump.

16. The device for evaluating long-term operation of a transformer oil pump according to claim 3, wherein
the UHF sensor is embedded in an inner wall of an oil pipe less than 0.5 m away from the oil pump; a signal line is led out from the corresponding oil pipe to the signal diagnosis module, to upload a UHF electromagnetic wave signal in the oil pump obtained under a test condition to the signal diagnosis module.

17. The device for evaluating long-term operation of a transformer oil pump according to claim 15, wherein
the UHF sensor is embedded in an inner wall of an oil pipe less than 0.5 m away from the oil pump; a signal line is led out from the corresponding oil pipe to the signal diagnosis module, to upload a UHF electromagnetic wave signal in the oil pump obtained under a test condition to the signal diagnosis module.

18. The device for evaluating long-term operation of a transformer oil pump according to claim 16, wherein
12 ultrasonic sensors are provided on a circumference of the oil pump; these ultrasonic sensors are equally 30 degrees spaced apart in a circumferential direction of the oil pump to detect abnormal vibrations of different parts in simultaneous domain under the test condition; a lead wire of each ultrasonic sensor is connected to the signal diagnosis module; if an output signal of an ultrasonic sensor is found exceeding a set threshold, an abnormal position of the oil pump is located according to the output signal of the ultrasonic sensor.

19. The device for evaluating long-term operation of a transformer oil pump according to claim 17, wherein
12 ultrasonic sensors are provided on a circumference of the oil pump; these ultrasonic sensors are equally 30 degrees spaced apart in a circumferential direction of the oil pump to detect abnormal vibrations of different parts in simultaneous domain under the test condition; a lead wire of each ultrasonic sensor is connected to the signal diagnosis module; if an output signal of an ultrasonic sensor is found exceeding a set threshold, an abnormal position of the oil pump is located according to the output signal of the ultrasonic sensor.

20. The device for evaluating long-term operation of a transformer oil pump according to claim 18, wherein
in the detection of a three-phase unbalanced current of a stator winding, an impeller of the oil pump is locked by using a clamp; the current transformer monitors the three-phase unbalanced current of the stator winding under the condition of the locked impeller of the oil pump, and uploads a three-phase unbalanced current signal to the signal diagnosis module.

* * * * *